US012550745B2

(12) United States Patent
Takahashi

(10) Patent No.: US 12,550,745 B2
(45) Date of Patent: Feb. 10, 2026

(54) OUTPUT MATCHING CIRCUIT AND POWER AMPLIFIER MODULE

(71) Applicant: Murata Manufacturing Co., Ltd., Kyoto (JP)

(72) Inventor: Kazuhiro Takahashi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 630 days.

(21) Appl. No.: 18/048,473

(22) Filed: Oct. 21, 2022

(65) Prior Publication Data

US 2023/0126728 A1 Apr. 27, 2023

(30) Foreign Application Priority Data

Oct. 22, 2021 (JP) .................. 2021-173296

(51) Int. Cl.
| | |
|---|---|
| *H01L 23/66* | (2006.01) |
| *H01L 23/552* | (2006.01) |
| *H01L 25/16* | (2023.01) |
| *H03F 1/56* | (2006.01) |
| *H03F 3/195* | (2006.01) |
| *H03F 3/24* | (2006.01) |

(52) U.S. Cl.
CPC ............ *H01L 23/66* (2013.01); *H01L 23/552* (2013.01); *H01L 25/16* (2013.01); *H03F 1/565* (2013.01); *H03F 3/195* (2013.01); *H03F 3/245* (2013.01); *H01L 2223/6616* (2013.01); *H01L 2223/6655* (2013.01); *H01L 2223/6672* (2013.01); *H01L 2223/6688* (2013.01); *H03F 2200/114* (2013.01); *H03F 2200/387* (2013.01); *H03F 2200/451* (2013.01)

(58) Field of Classification Search
CPC ....... H01L 23/66; H01L 23/552; H01L 25/16; H01L 2223/6616; H01L 2223/6655; H01L 2223/6672; H01L 2223/6688; H03F 1/565; H03F 3/195; H03F 3/245; H03F 2200/114; H03F 2200/387; H03F 2200/451; H03F 1/56
USPC ........................................................ 330/302
See application file for complete search history.

(56) References Cited

U.S. PATENT DOCUMENTS

| | | | |
|---|---|---|---|
| 2016/0294333 A1 | 10/2016 | Feng et al. | |
| 2021/0210429 A1* | 7/2021 | Liu | ............... H01L 23/5286 |
| 2021/0336592 A1* | 10/2021 | Arayashiki | ............... H03F 3/72 |
| 2022/0182025 A1* | 6/2022 | Akamine | ................ H03F 3/195 |

(Continued)

FOREIGN PATENT DOCUMENTS

JP 2016-195393 A 11/2016

*Primary Examiner* — Andrea Lindgren Baltzell
*Assistant Examiner* — Jose E Pinero
(74) *Attorney, Agent, or Firm* — McDonald Hopkins LLC

(57) ABSTRACT

An output matching circuit includes a transformer having one end electrically connected to an output terminal of a power amplifier element that amplifies an input signal and another end electrically connected to a terminal connected to a load, and converting an impedance of the terminal connected to the load to an impedance higher than an impedance of the output terminal, a first filter circuit that attenuates a signal within a first frequency band higher than a transmission frequency band of the input signal, and a second filter circuit that attenuates a signal within a second frequency band higher than the first frequency band.

11 Claims, 8 Drawing Sheets

(56) References Cited

U.S. PATENT DOCUMENTS

2023/0053456 A1* 2/2023 Hase .................... H01P 5/02
2023/0086793 A1* 3/2023 Katamata ............ H03F 3/245
                                                        455/552.1

* cited by examiner

OUTPUT MATCHING CIRCUIT AND POWER AMPLIFIER MODULE

CROSS REFERENCE TO RELATED APPLICATION

This application claims priority from Japanese Patent Application No. 2021-173296 filed on Oct. 22, 2021. The content of this application is incorporated herein by reference in its entirety.

BACKGROUND ART

The present disclosure relates to an output matching circuit and a power amplifier module.

A mobile communication terminal such as a cellular phone uses a power amplifier circuit that amplifies radio frequency (RF) signals to be transmitted to a base station. The power amplifier circuit includes a harmonic termination circuit in order to improve efficiency thereof (e.g., Japanese Unexamined Patent Application Publication No. 2016-195393).

The power amplifier module described in Japanese Unexamined Patent Application Publication No. 2016-195393 includes an output stage transistor (output stage transistor 104 in this case), a plurality of harmonic termination circuits (harmonic termination circuits 302 and 304 in this case) connected to an output terminal of the output stage transistor, and an output matching circuit (output impedance matching network 112 in this case) provided between the output stage transistor and a circuit in a subsequent stage. The plurality of harmonic termination circuits attenuate harmonic components contained in an amplified signal output from the output stage transistor. However, in the power amplifier module described in Japanese Unexamined Patent Application Publication No. 2016-195393, since the harmonic termination circuits are provided between the output stage transistor and the output matching circuit, the loss in the output matching circuit increases, and there is a risk of hindering the efficiency improvement of the power amplifier circuit.

BRIEF SUMMARY

The present disclosure to secure attenuation within a frequency band in which attenuation is desired to be performed and to suppress loss within a frequency band in which attenuation is not desired in a power amplifier circuit.

An output matching circuit according to one aspect of the present disclosure includes a transformer having one end electrically connected to an output terminal of a power amplifier element that amplifies an input signal and another end electrically connected to a terminal connected to a load, and converting an impedance of the terminal connected to the load to an impedance higher than an impedance of the output terminal, a first filter circuit that attenuates a signal within a first frequency band higher than a transmission frequency band of the input signal, and a second filter circuit that attenuates a signal within a second frequency band higher than the first frequency band. The first filter circuit has one end electrically connected to a wiring line between the output terminal and the terminal connected to the load at a first node and another end electrically connected to ground, and the second filter circuit has one end electrically connected to a wiring line between the transformer and the terminal connected to the load at a second node and another end electrically connected to the ground.

According to the present disclosure, it is possible to secure attenuation within a frequency band in which attenuation is desired to be performed and to suppress loss within a frequency band in which attenuation is not desired in a power amplifier circuit.

DETAILED DESCRIPTION

Hereinafter, embodiments of the present disclosure will be described with reference to the drawings. Here, circuit elements denoted by the same reference symbols indicate the same circuit elements, and redundant description thereof will be omitted.

Configuration of Power Amplifier Module 100

Figure 1:
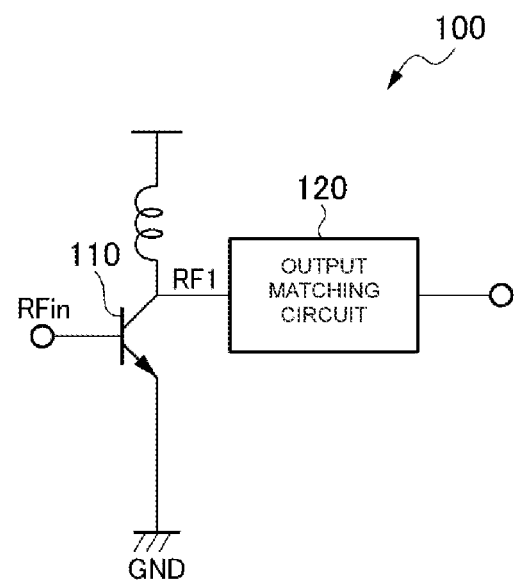
FIG. 1 is a diagram illustrating an overview of a configuration of a power amplifier module.

A configuration of a power amplifier module 100 will be described with reference to FIG. 1. FIG. 1 is a diagram illustrating an overview of the configuration of the power amplifier module 100. The power amplifier module 100 is mounted on, for example, a mobile communication device such as a cellular phone, and amplifies the power of an input signal RFin to a level suitable for transmission to a base station, and outputs the amplified signal as an amplified signal RFout. The input signal RFin is a radio frequency (RF) signal modulated by, for example, a radio frequency integrated circuit (RFIC) or the like in accordance with a predetermined communication scheme. Examples of the communication standards for the input signal RFin include the second generation mobile communication system (2G), third generation mobile communication system (3G), fourth generation mobile communication system (4G), fifth generation mobile communication system (5G), Long-Term Evolution Frequency-Division Duplex (LTE-FDD), Long-Term Evolution Time-Division Duplex (LTE-TDD), LTE- Advanced, and LTE-Advanced Pro, and the frequencies are, for example, several hundred MHz to several tens of GHz. Note that the communication standards and frequencies for the input signal RFin are not limited thereto.

As illustrated in FIG. 1, the power amplifier module 100 includes, for example, a power amplifier element 110 and an output matching circuit 120. In the embodiment, the power amplifier module 100 is described as a single-stage configuration, but is not limited thereto. For example, the power amplifier module 100 may have a configuration of two or more stages. In this case, the power amplifier module 100 includes matching circuits between the respective plurality of power amplifier elements.

The power amplifier element 110 amplifies an input RF signal and outputs the amplified signal. The power amplifier element 110 amplifies an input signal RFin input from an input terminal and outputs an RF signal RF1. The power amplifier element 110 is, for example, a heterojunction bipolar transistor (HBT). The power amplifier element 110 may be a metal-oxide-semiconductor field-effect transistor (MOSFET) instead of the HBT. In this case, a collector, a base, and an emitter can be read as a drain, a gate, and a source, respectively. In the following description, unless otherwise specified, a case in which the transistor is an HBT will be described as an example.

The output matching circuit 120 is a circuit that secures attenuation within a frequency band in which attenuation is desired to be performed and matches an impedance of an output terminal (collector) of the power amplifier element 110 with an impedance of a terminal connected to a load. The output matching circuit 120 has, for example, a configuration capable of suppressing loss of the RF signal RF1 within the pass band. Hereinafter, the output matching circuit 120 will be described in detail.

Configuration of Output Matching Circuit 120

Figure 2:
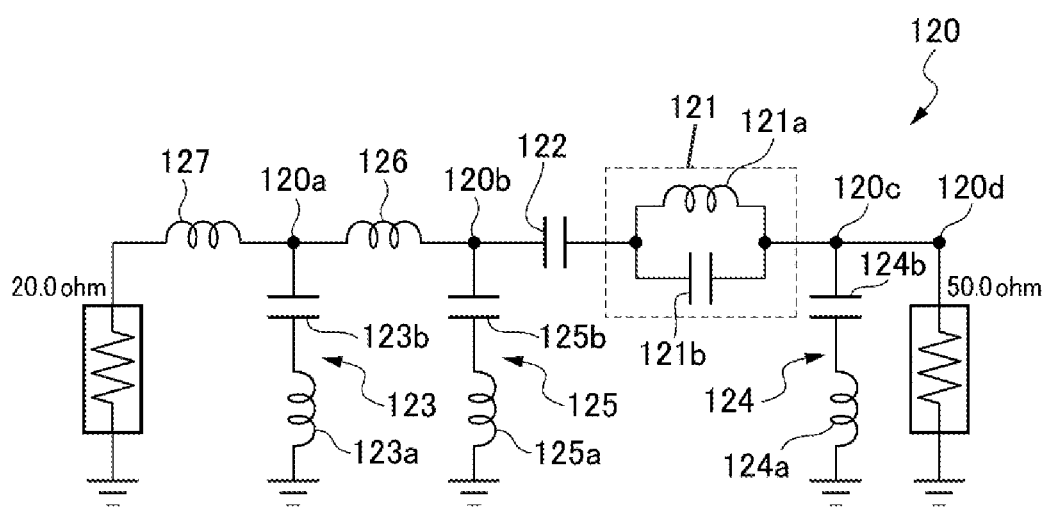
FIG. 2 is a diagram illustrating an example of a configuration of an output matching circuit according to an embodiment.

A configuration of the output matching circuit 120 according to the embodiment will be described with reference to FIG. 2. FIG. 2 is a diagram illustrating an example of the configuration of the output matching circuit 120 according to the embodiment. In FIG. 2, as an example, an impedance of an input end is 20.0 ohms and an impedance of an output end (output terminal 120d connected to the load) is 50.0 ohms. As illustrated in FIG. 2, the output matching circuit 120 includes, for example, a transformer 121, a coupling capacitor 122, a filter circuit 123, a filter circuit 124, a filter circuit 125, an inductor 126, and an inductor 127.

The transformer 121 is, for example, a circuit for matching the impedance of the input end of the output matching circuit 120 with the impedance of the load. The transformer 121 includes, for example, an inductor 121a and a capacitor 121b connected in parallel. In FIG. 2, as an example, it is assumed that the output matching circuit 120 converts the input end impedance of 20.0 ohms to the output end impedance of 50.0 ohms through the transformer 121. In other words, the transformer 121 is a transformer that converts the impedance of the output terminal 120d connected to the load to an impedance higher than the impedance of the output terminal of the power amplifier element 110. The transformer 121 may be a transformer that converts the impedance by magnetic coupling. For example, the transformer 121 may be a transmission line transformer.

The coupling capacitor 122 is, for example, an element that cuts off a DC component. The coupling capacitor 122 is electrically connected in series to an input terminal of the transformer 121. The coupling capacitor 122 matches the filter circuits 123 and 125, which will be described later, with the transformer 121.

The filter circuit 123 is, for example, a circuit that attenuates signals within a first frequency band. The first frequency band is a frequency band higher than a transmission frequency band for the RF signal RF1. The first frequency band is a frequency band that is an integer multiple of the transmission frequency band. Hereinafter, as an example, the first frequency band will be described as a frequency band twice the transmission frequency band (hereinafter, referred to as a "second harmonic wave"). In the filter circuit 123, for example, an inductor 123a and a capacitor 123b form a series resonance circuit. One end of the filter circuit 123 is electrically connected to, for example, a wiring line between the collector of the power amplifier element 110 and the transformer 121 at a node 120a. Another end of the filter circuit 123 is connected to ground. That is, since the filter circuit 123 short-circuits the signals within the first frequency band, the second harmonic wave contained in the RF signal RF1 can be led to the ground. Here, "short-circuit" refers to, for example, a state in which the load impedance of a predetermined high-order harmonic wave approaches "0" due to resonance between the inductor 123a and the capacitor 123b within a predetermined frequency band.

The filter circuit 124 is, for example, a circuit that attenuates signals within a second frequency band. The second frequency band is a frequency band higher than the first frequency band and a third frequency band described later. In other words, the second frequency band is the highest frequency band among the frequency bands attenuated by the filter circuits included in the output matching circuit 120. The second frequency band is a frequency band that is an integer multiple of the transmission frequency band. Hereinafter, as an example, the second frequency band will be described as a frequency band four times the transmission frequency band (hereinafter, referred to as a "fourth harmonic wave"). In the filter circuit 124, for example, an inductor 124a and a capacitor 124b form a series resonance circuit. One end of the filter circuit 124 is electrically connected to, for example, a wiring line between the transformer 121 and the output terminal 120d connected to the load at a node 120c. Another end of the filter circuit 124 is connected to the ground. That is, since the filter circuit 124 short-circuits the signals within the second frequency band, the fourth harmonic wave contained in the RF signal RF1 can be led to the ground. Thus, the output matching circuit 120 can perform output matching without necessarily increasing the impedance of 50.0 ohms at the output end on the Smith chart. Therefore, the output matching circuit 120 can suppress loss in the power amplifier module 100.

The filter circuit 125 is, for example, a circuit that attenuates signals within the third frequency band. The third frequency band is a frequency band higher than the first frequency band and lower than the second frequency band. The third frequency band is a frequency band that is an integer multiple of the transmission frequency band. Hereinafter, as an example, the third frequency band will be described as a frequency band three times the transmission frequency band (hereinafter, referred to as a "third harmonic wave"). In the filter circuit 125, for example, an inductor 125a and a capacitor 125b form a series resonance circuit. One end of the filter circuit 125 is electrically connected to the wiring line between the collector of the power amplifier element 110 and the transformer 121 (or the coupling capacitor 122) at a node 120b. Another end of the filter circuit 125 is connected to the ground. That is, the filter circuit 125 leads the third harmonic wave contained in the RF signal RF1 to the ground. The node 120b can be located closer to the transformer 121 than the node 120a.

Note that the output matching circuit 120, for example, may be configured such that a plurality of filter circuits, one ends of which electrically connected to the wiring line between the collector of the power amplifier element 110 and the transformer 121 at predetermined nodes and the other ends of which are electrically connected to the ground, attenuate signals within frequency bands higher than the transmission frequency band and lower than the second frequency band. Further, the output matching circuit 120 may be configured such that a filter circuit that attenuates the highest harmonic wave (signals within the highest frequency band) among the filter circuits is connected between the transformer 121 and the output terminal 120d connected to the load. That is, the output matching circuit 120 may include, for example, the filter circuit 123 that attenuates the second harmonic wave and the filter circuit 124 that is connected to the wiring line between the transformer 121 and the output terminal 120d at the node and attenuates the third harmonic wave.

Although the filter circuit 123 and the filter circuit 125 are described as being electrically connected to the wiring line between the transformer 121 and the power amplifier element 110 at the nodes, the connection points of the filter circuit 123 and the filter circuit 125 to the wiring line are not limited thereto. For example, the filter circuit 123 and the filter circuit 125 may be electrically connected to the wiring line between the transformer 121 and the output terminal 120d connected to the load at nodes.

The inductor 126 and the inductor 127 are elements for converting the phase of the RF signal RF1.

Behavior of Impedance in Output Matching Circuit 120

Figure 3:
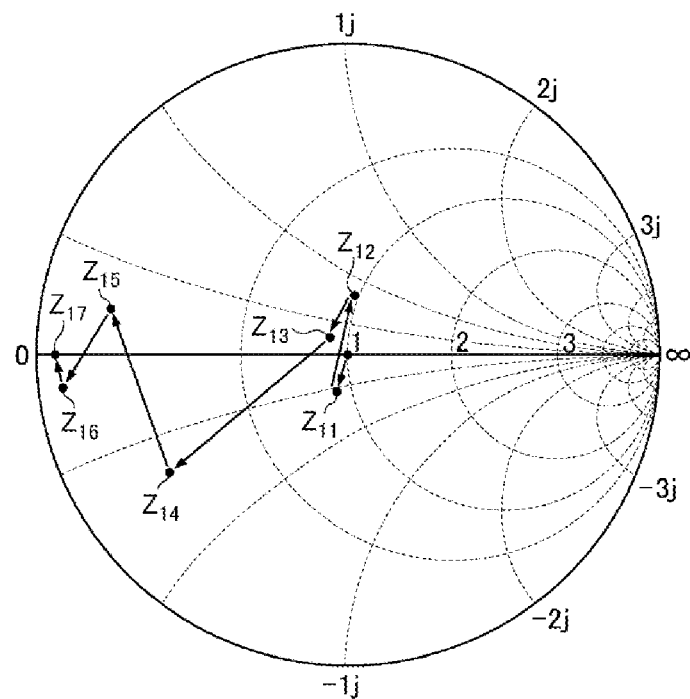
FIG. 3 is a Smith chart showing a locus of the impedance of the output matching circuit.

Next, the behavior of the impedance in the output matching circuit 120 will be described with reference to FIG. 3. FIG. 3 is a Smith chart showing a locus of the impedance in the output matching circuit 120. In the Smith chart in FIG. 3, the center point is 50.0 ohms (denoted by "1" in FIG. 3).

Next, the locus of the impedance in the output matching circuit 120 will be described with reference to FIG. 3.

As shown in FIG. 3, in the output matching circuit 120, the filter circuit 124 shifts the impedance from the center point to $Z_{11}$ in a capacitive region on the Smith chart. The transformer 121 then shifts the impedance from $Z_{11}$ to $Z_{12}$ in an inductive region. The coupling capacitor 122 then shifts the impedance from $Z_{12}$ to $Z_{13}$ shifted toward the capacitive region. The locus of the impedance indicated by $Z_{11}$ to $Z_{13}$ is a locus that approximately overlaps with a circle of equal resistance indicating the resistive component of the impedance of 50.0 ohms. Thus, since the resistive component of the impedance of the output matching circuit 120 does not exceed 50 ohms, loss can be suppressed. The impedance is then shifted to the vicinity of the real part of 20.0 ohms by the filter circuit 125 ($Z_{14}$), the inductor 126 ($Z_{15}$), the filter circuit 123 ($Z_{16}$), and the inductor 127 ($Z_{17}$). From the above, it can be seen that loss can be suppressed in the output matching circuit 120 by providing a filter circuit (here, the filter circuit 124) on the load side of the transformer 121 that attenuates signals within a frequency band higher than a frequency band within which signals are attenuated by any of filter circuits (here, any one of the filter circuit 123 and the filter circuit 125) provided between the collector of the power amplifier element 110 and the transformer 121 among the filter circuits included in the output matching circuit 120. Thus, for example, when the filter circuit 124 that attenuates the fourth harmonic wave is provided between the collector of the power amplifier element 110 and the transformer 121 and the filter circuit 125 that attenuates the third harmonic wave is provided on the load side of the transformer 121, loss can be similarly suppressed. Moreover, it can be seen that loss can be more effectively suppressed in the output matching circuit 120 by providing a filter circuit (here, the filter circuit 124) that attenuates signals within the highest frequency band among the filter circuits included in the output matching circuit 120 on the load side of the transformer 121.

Comparative Examples of Output Matching Circuit 120

Figure 4:
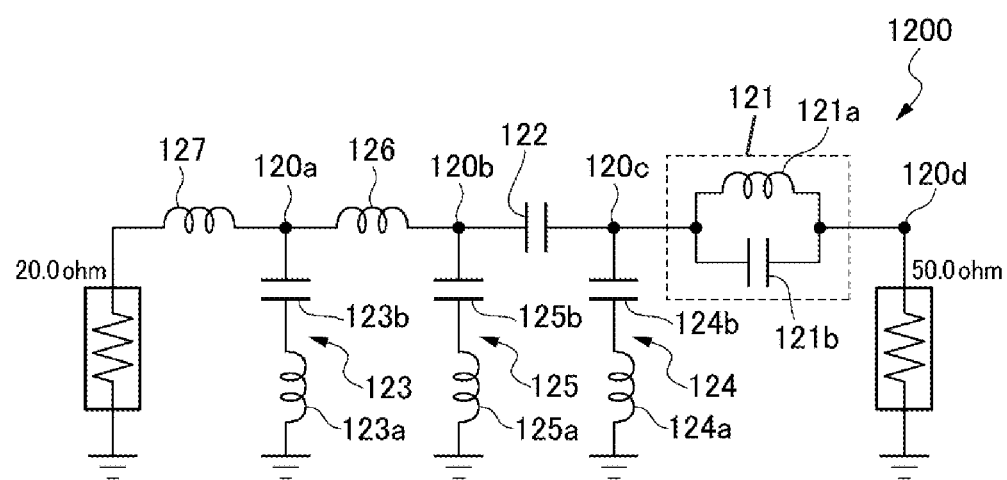
FIG. 4 is a diagram illustrating an example of a configuration of an output matching circuit according to a first comparative example.
Figure 5:
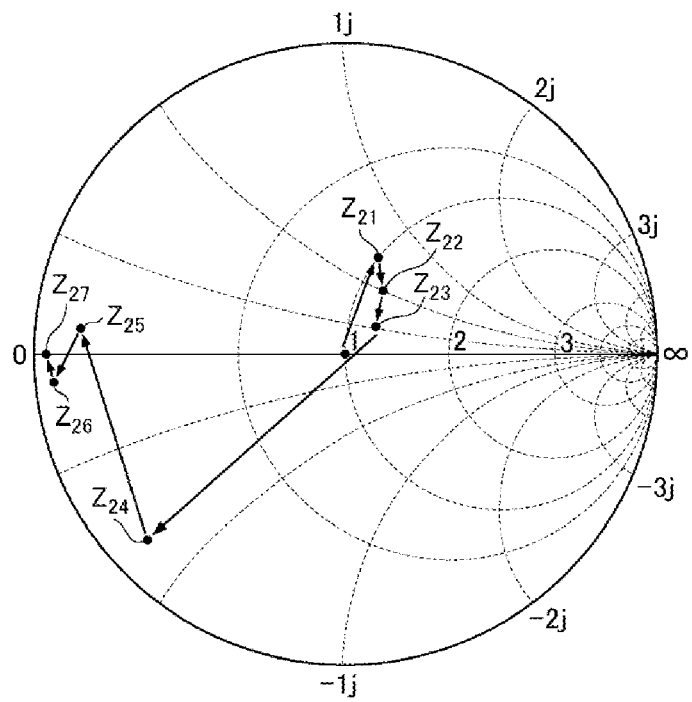
FIG. 5 is a Smith chart showing a locus of the impedance of the output matching circuit according to the first comparative example.

Next, a locus of the impedance in an output matching circuit 1200 according to a first comparative example will be described with reference to FIGS. 4 and 5. FIG. 4 is a diagram illustrating an example of a configuration of the output matching circuit 1200 according to the first comparative example. FIG. 5 is a Smith chart showing the locus of the impedance in the output matching circuit 1200 according to the first comparative example.

As illustrated in FIG. 4, the output matching circuit 1200 is a circuit in which the filter circuit 124 is connected to the wiring line between the transformer 121 and the collector of the power amplifier element 110, as compared with the output matching circuit 120. Thus, the constituent elements of the output matching circuit 1200 are the same as those of the output matching circuit 120, and the description thereof will be omitted.

As shown in FIG. 5, in the output matching circuit 1200, the transformer 121 shifts the impedance from the center point (50 ohms) to $Z_{21}$ in the inductive region on the Smith chart in a direction of increasing the impedance. The filter circuit 124 then shifts the impedance from $Z_{21}$ to $Z_{22}$ toward the capacitive region, which is a direction of increasing the resistive component of the impedance. The coupling capacitor 122 then shifts the impedance from $Z_{22}$ to $Z_{23}$ toward the capacitive region. Thus, in the output matching circuit 1200, the resistive component of the impedance exceeds 50 ohms while the impedance shifts from $Z_{21}$ to $Z_{23}$. Thus, loss in the output matching circuit 1200 is increased compared to the output matching circuit 120 in which the filter circuit 124 is provided on the load side of the transformer 121.

Figure 6:
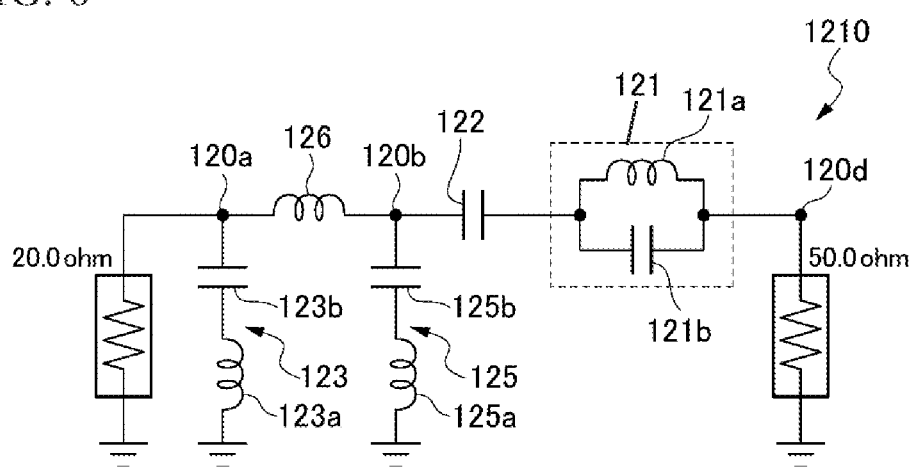
FIG. 6 is a diagram illustrating an example of a configuration of an output matching circuit according to a second comparative example.
Figure 7:
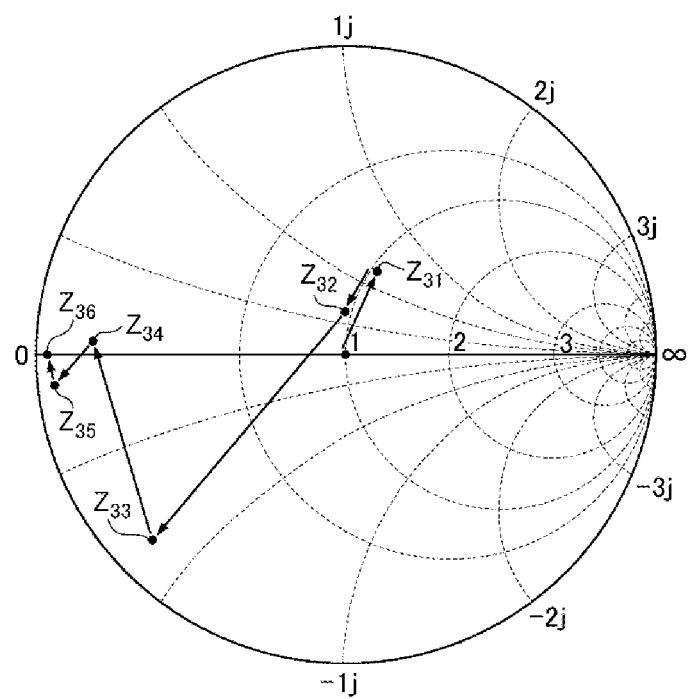
FIG. 7 is a Smith chart showing a locus of the impedance of the output matching circuit according to the second comparative example.

Next, a locus of the impedance in an output matching circuit 1210 according to a second comparative example will be described with reference to FIGS. 6 and 7. FIG. 6 is a diagram illustrating an example of a configuration of the output matching circuit 1210 according to the second comparative example. FIG. 7 is a Smith chart showing the locus of the impedance in the output matching circuit 1210 according to the second comparative example.

As illustrated in FIG. 6, the output matching circuit 1210 is a circuit obtained by excluding the filter circuit 124 from the output matching circuit 120. Thus, the constituent elements of the output matching circuit 1210 are similar to those of the output matching circuit 120, and the description thereof will be omitted.

As shown in FIG. 7, in the output matching circuit 1210, the transformer 121 shifts the impedance from the center point to $Z_{31}$ in the inductive region on the Smith chart in a direction of increasing the impedance. The coupling capacitor 122 then shifts the impedance from $Z_{31}$ to $Z_{32}$ toward the capacitive region. Thus, in the output matching circuit 1210, the impedance increases while the impedance shifts from $Z_{31}$ to $Z_{32}$, so that loss increases as compared with the output matching circuit 120.

Multilayer Structure of Power Amplifier Module 100

Figure 8:
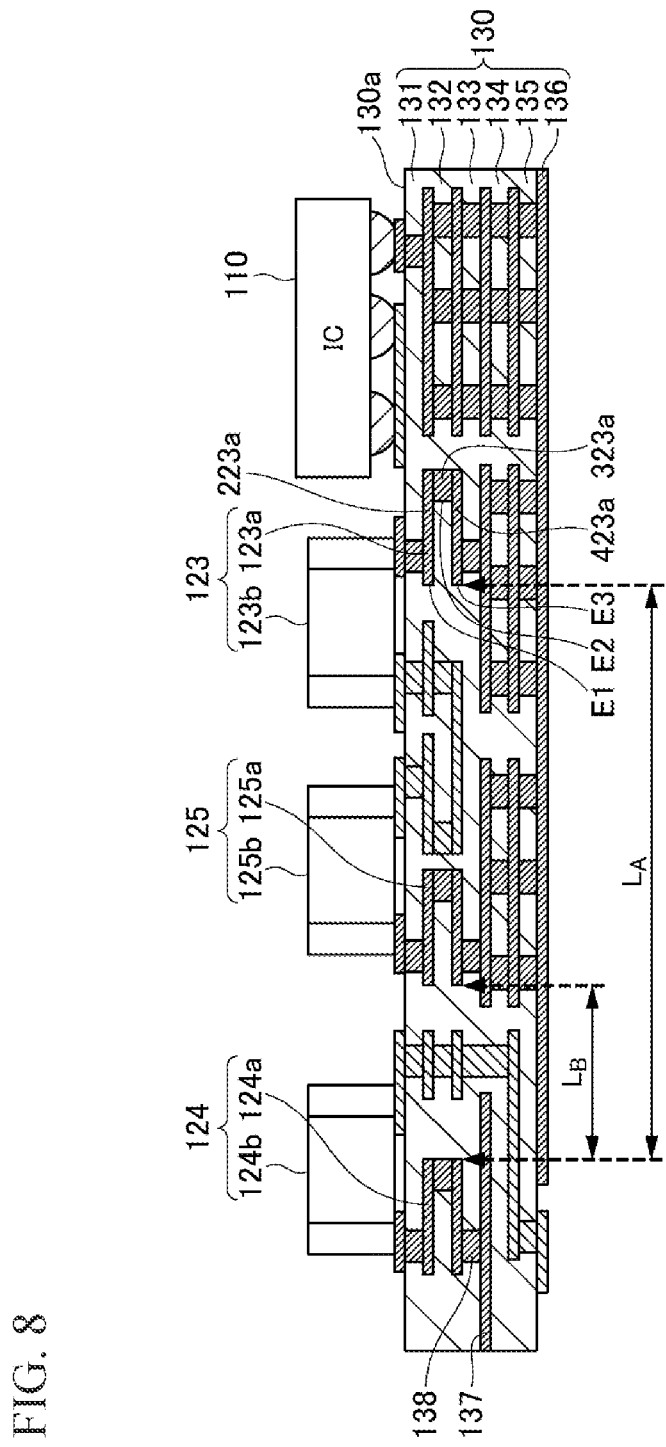
FIG. 8 is a diagram illustrating an example of a multilayer structure of the power amplifier module.
Figure 9:
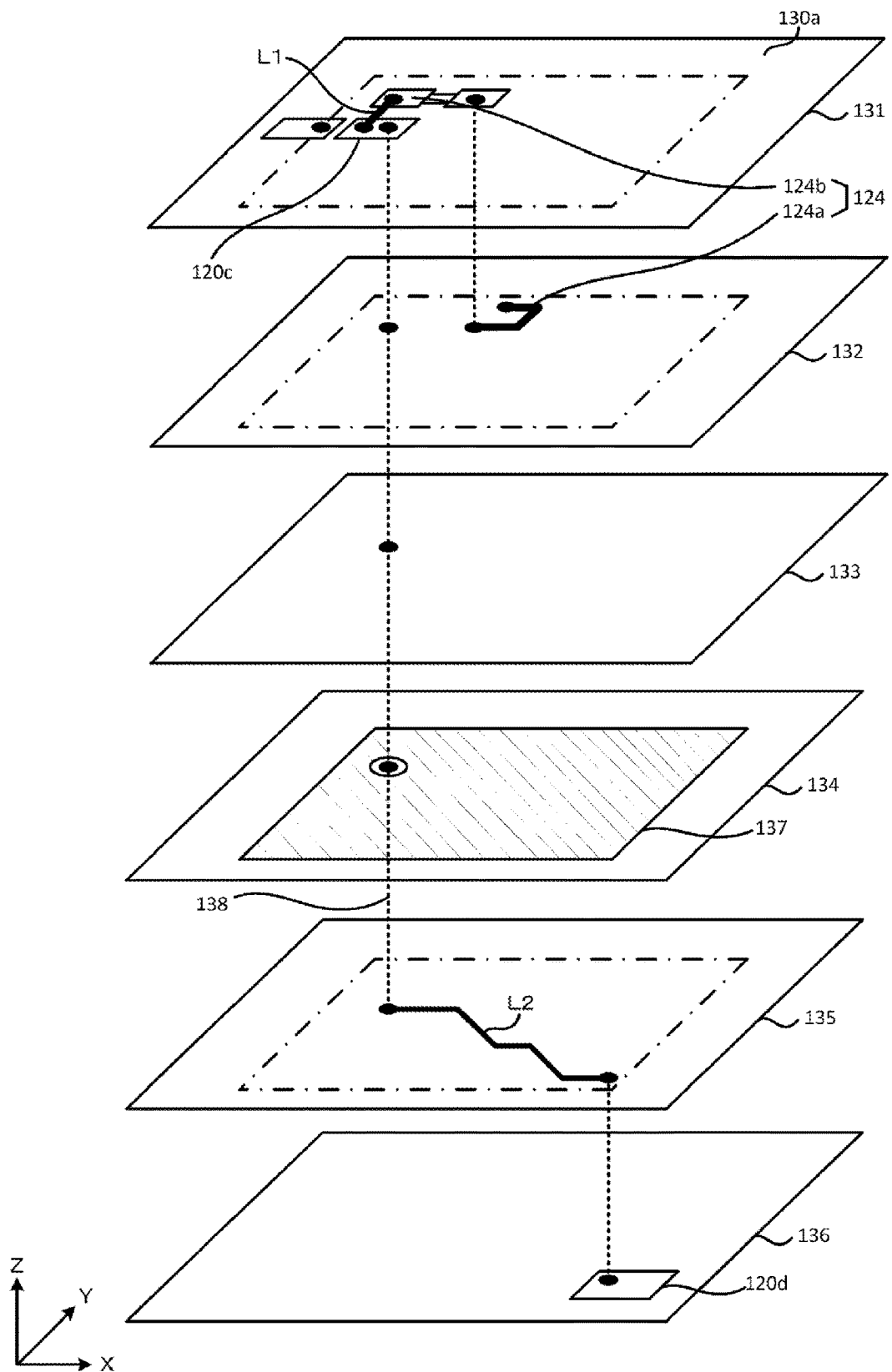
FIG. 9 is an exploded view illustrating the example of multilayer structure of the power amplifier module.
Figure 10:
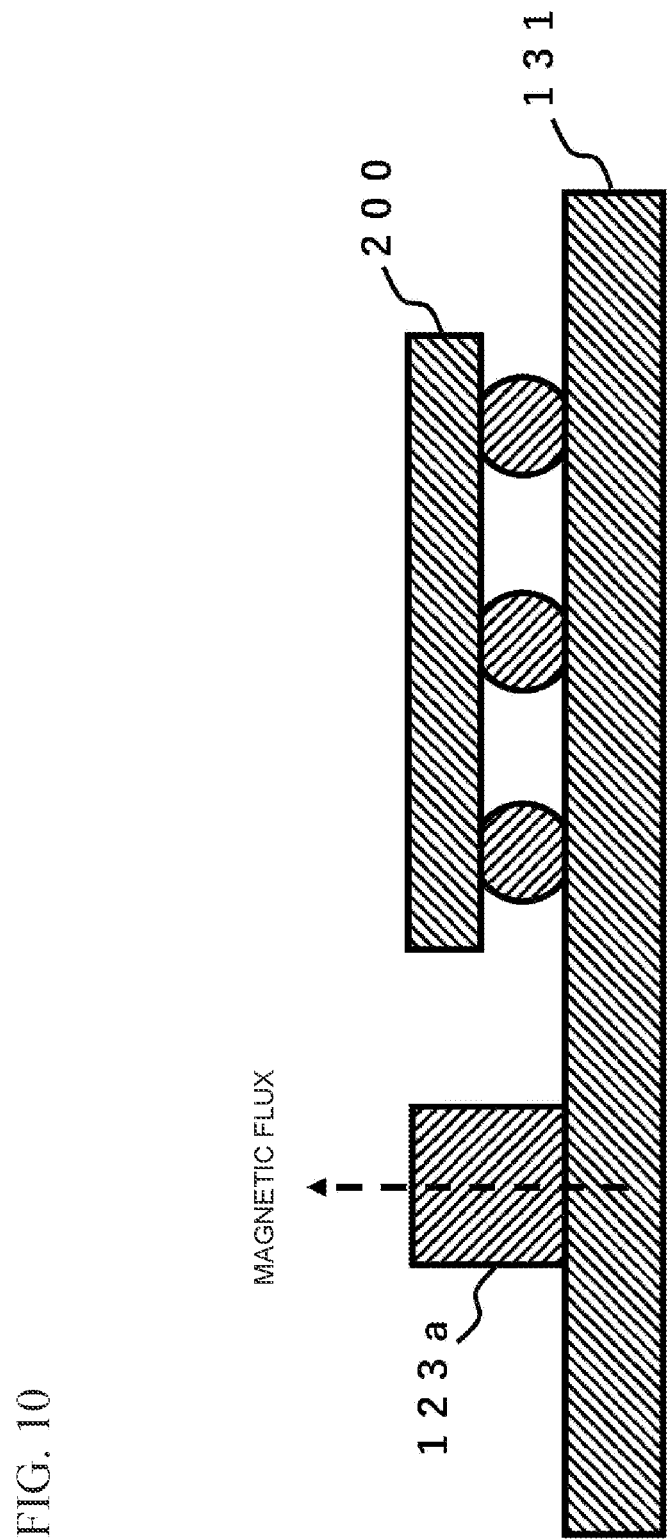
FIG. 10 is a diagram illustrating a relationship between an inductor and an electronic component mounted on a surface of the multilayer structure of the power amplifier module.
Figure 11:
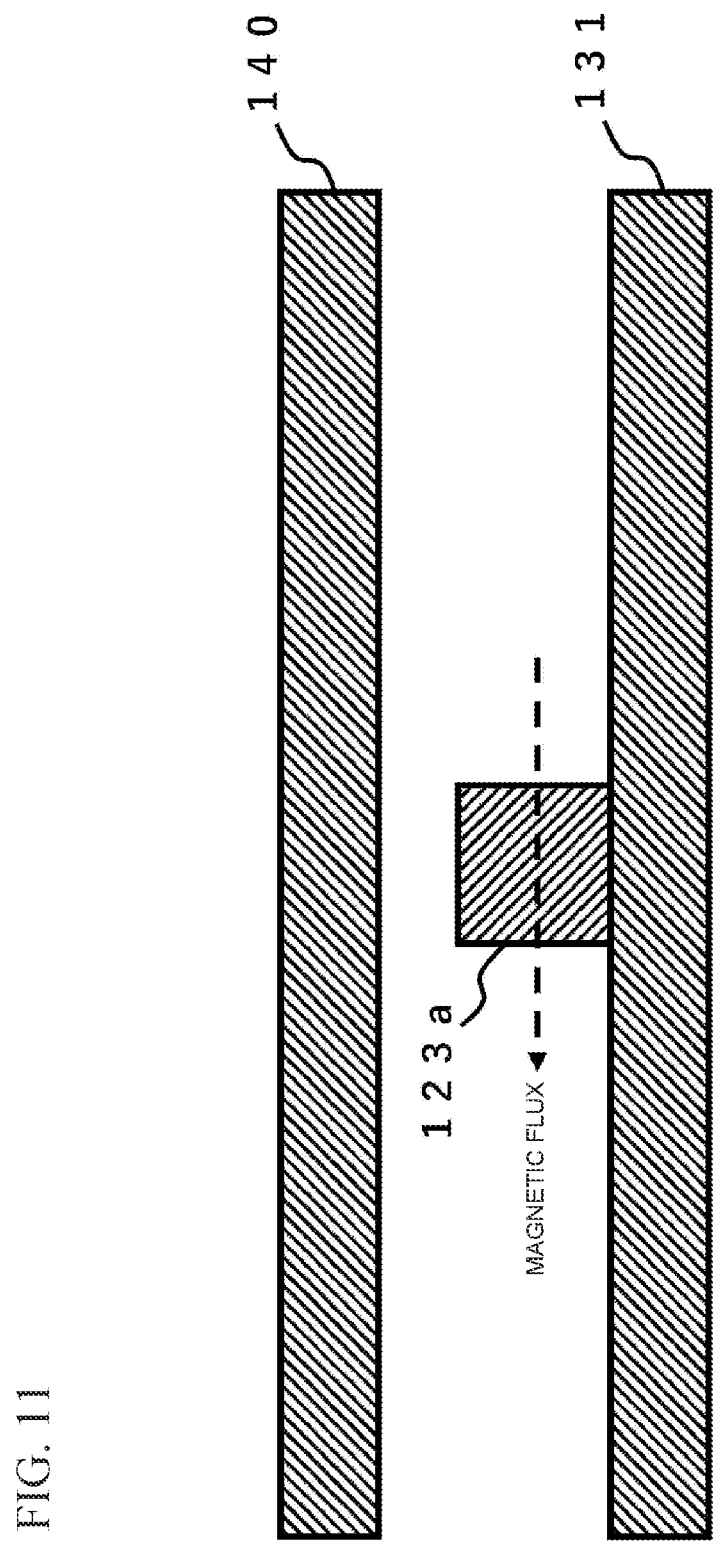
FIG. 11 is a diagram illustrating a relationship between the inductor and the electronic component mounted on the surface of the multilayer structure of the power amplifier module.

Next, a multilayer structure of the power amplifier module 100 will be described with reference to FIGS. 8 to 11. FIG. 8 is a diagram illustrating an example of the multilayer structure of the power amplifier module 100. FIG. 9 is an exploded perspective view illustrating the example of the multilayer structure of the power amplifier module 100. Each of FIGS. 10 and 11 is a diagram illustrating a relationship between an inductor and an electronic component mounted on a surface of the multilayer structure of the power amplifier module 100. In FIGS. 8 to 11, for example, the x-axis is an axis along a predetermined direction parallel to a surface 130a of a multilayer substrate 130, the y-axis is an axis orthogonal to the x-axis parallel to the surface 130a of the multilayer substrate 130, and the z-axis is an axis along a laminating direction (direction orthogonal to the x-axis and the y-axis).

As illustrated in FIG. 8, the power amplifier module 100 includes the multilayer substrate 130 including a plurality of layers. The multilayer substrate 130 is, for example, formed by including a thermosetting resin material, such as an epoxy resin. The multilayer substrate 130 includes the output matching circuit 120. To be specific, as illustrated in FIG. 8, in the power amplifier module 100, for example, the power amplifier element 110 and the capacitors 123b to 125b included in the filter circuits are provided on the surface 130a of the uppermost layer 131 of the multilayer substrate 130. For example, the inductors 123a to 125a included in the filter circuits, a ground 137, and via conductors 138 are provided in inner layers 132 to 135 of the multilayer substrate 130. For example, a ground 139 and the output terminal 120d connected to the load are provided in the lowermost layer 136 of the multilayer substrate 130.

First, with reference to FIG. 8, the multilayer structure that suppresses deterioration of the characteristics of the power amplifier module 100 will be described. In the power amplifier module 100, the filter circuits are arranged so that a distance between the plurality of filter circuits that attenuate signals within frequency bands that are integer multiples, which have the same attribute indicating an even number or an odd number, of the transmission frequency band is larger than a distance between the plurality of filter circuits that attenuate signals within frequency bands that are integer multiples, which have different attributes indicating an even number and an odd number, of the transmission frequency band. Thus, in the power amplifier module 100, deterioration of the characteristics due to interference between the plurality of filter circuits can be suppressed. Here, "integer multiples, which have the same attribute indicating an even number or an odd number" refers to, for example, a case in which the integers indicating ratios to the transmission frequency band are either an even number or an odd number, such as a combination of two times and four times or a combination of three times and five times. On the other hand, "integer multiples, which have different attributes indicating an even number or an odd number" refers to a case in which the integers indicating the ratio to the transmission frequency band are an even number and an odd number, such as a combination of two times and three times or a combination of four times and five times.

Specifically, as illustrated in FIG. 8, the power amplifier module 100 is configured such that a distance between the filter circuit 123 that attenuates the second harmonic wave and the filter circuit 124 that attenuates the fourth harmonic wave is $L_A$. To be specific, as illustrated in FIG. 8, the power amplifier module 100 is configured such that a distance between the inductor 123a included in the filter circuit 123 and the inductor 124a included in the filter circuit 124 is $L_A$. The "distance between the inductor 123a and the inductor 124a" is, as illustrated in FIG. 8, the shortest distance between an end portion of the inductor 123a included in the filter circuit 123 that is closest to the inductor 124a included in the filter circuit 124 and an end portion of the inductor 124a included in the filter circuit 124 that is closest to the inductor 123a included in the filter circuit 123. Note that the "end portion" of the inductor refers to end portions of one or more wiring lines forming the inductor. For example, in FIG. 8, the inductor 123a includes a wiring line 223a provided between the inner layer 131 and the inner layer 132 of the multilayer substrate 130, a wiring line (via conductor) 323a provided between the inner layer 132 and the inner layer 133, and a wiring line 423a provided between the inner layer 132 and the inner layer 133. In this case, the end portion of the inductor 123a refers to an end portion E1 of the wiring line 223a, an end portion E2 of the wiring line 323a, and an end portion E3 of the wiring line 423a, and the "end portion closest to the inductor 124a" refers to the end portion E1 or the end portion E3 closest to the inductor 124a among the end portions E1, E2, and E3. The power amplifier module 100 is configured such that a distance between the filter circuit 125 that attenuates the third harmonic wave and the filter circuit 124 that attenuates the fourth harmonic wave is $L_B$. To be specific, as illustrated in FIG. 8, the power amplifier module 100 is configured such that a distance between the inductor 125a included in the filter circuit 125 and the inductor 124a included in the filter circuit 124 is $L_B$. That is, in the power amplifier module 100 illustrated in FIG. 8, the distance between the filter circuits that attenuate harmonic waves that are even multiples (here, two times and four times) of the transmission frequency band is $L_A$, and the distance between the filter circuit that attenuates a harmonic wave that is even multiple (here, four times) of the transmission frequency band and the filter circuit that attenuates a harmonic wave that is odd multiple (here, three times) of the transmission frequency band is $L_B$. In the power amplifier module 100, the filter circuit 123, the filter circuit 124, and the filter circuit 125 are arranged such that the distance $L_A$ is larger than the distance $L_B$.

Next, the multilayer structure that suppresses an increase in impedance of the output matching circuit 120 will be described with reference to FIG. 9. As described above, the output matching circuit 120 suppresses loss by electrically connecting the filter circuit 124 to the wiring line between the transformer 121 and the output terminal 120d connected to the load at the node 120c. Hereinafter, wiring lines related to the filter circuit 124 for suppressing loss in the output matching circuit 120 will be described.

To be specific, as illustrated in FIG. 9, in the output matching circuit 120, the filter circuit 124 is connected to the output terminal 120d via a wiring line L1 that electrically connects the filter circuit 124 to the node 120c and a wiring line L2 that electrically connects the node 120c to the output terminal 120d connected to the load. The output matching circuit 120 is arranged such that the length of the wiring line L1 is shorter than the length of the wiring line L2. When the length of the wiring line L1 is longer than the length of the wiring line L2, for example, the impedance of the wiring line L1 increases, which causes the impedance to shift from the center point in the direction of increasing impedance on the Smith chart shown in FIG. 3, thereby increasing loss. Thus, as described above, in order to suppress loss in the output matching circuit 120, the length of the wiring line L1 is made shorter than the length of the wiring line L2. In the output matching circuit 120, the shorter the wiring line L2 is, the more loss can be suppressed.

Next, with reference to FIG. 9, the multilayer structure that suppresses deterioration of the characteristics of the power amplifier module 100 will be described. The power amplifier module 100 includes the layer 134 in which the ground 137 is formed that overlaps the wiring line L2 and the filter circuit 124 in a plan view between the layer 135 in which the wiring line L2 electrically connecting the output terminal 120d connected to the load to the node 120c is formed and the layer 131 in which the filter circuit 124 is formed. Thus, in the power amplifier module 100, deterioration of the characteristics due to interference between the filter circuit 124 and the wiring line L2 is suppressed.

Specifically, as illustrated in FIG. 9, in the power amplifier module 100, the ground 137 is formed in the layer 134. For convenience, in FIG. 9, regions corresponding to the ground 137 in the layer 134 are indicated by alternate long and short dash lines in the layer 135 in which the wiring line L2 is formed and the layer 131 (wiring line L1) and the layer 132 (inductor 124a) in which the filter circuit 124 is formed. In other words, the power amplifier module 100 is configured such that the wiring line L2, and the wiring line L1, the inductor 124a, and the capacitor 124b, which constitute the filter circuit 124, overlap the ground 137 when viewed in plan from the z-axis direction.

Next, with reference to FIGS. 10 and 11, the multilayer structure for suppressing deterioration of the characteristics of the power amplifier module 100 will be described. As illustrated in FIG. 10, in the power amplifier module 100, at least one of the inductor 121a of the transformer 121 and the inductors 123a to 124a of the filter circuits 123 to 124 (FIG. 10 illustrates the inductor 123a) and a predetermined electronic component 200 adjacent thereto are mounted on the surface 130a of the multilayer substrate 130. In this case, in the power amplifier module 100, the inductor is mounted on the surface 130a with the magnetic flux of the inductor to direct in the z-axis direction so that a direction of the magnetic flux of the inductor (e.g., a dashed arrow in FIG. 10) does not interfere with the predetermined electronic component 200.

As illustrated in FIG. 11, the power amplifier module 100 may include a shield member 140 that electromagnetically shields the surface 130a of the multilayer substrate 130. The shield member 140 may be provided, for example, on the surface 130a of the multilayer substrate 130 and on a mold resin layer (not illustrated) that seals one or more elements mounted on the surface 130a. The shield member 140 is made of, for example, metal such as copper, silver, or nickel. The shield member 140 is connected to the ground of the multilayer substrate 130. In the power amplifier module 100, for example, the inductor is mounted on the surface 130a with the magnetic flux of the inductor perpendicular to the z-axis direction so that the direction of the magnetic flux of the inductor (e.g., a dashed arrow in FIG. 11) does not intersect the shield member 140. In other words, the inductor is mounted on the surface 130a of the multilayer substrate 130 so that the direction of magnetic flux is parallel to the surface 130a.

SUMMARY

The output matching circuit 120 of the power amplifier module 100 according to the exemplary embodiment of the present disclosure includes the transformer 121 having one end electrically connected to the collector (output terminal) of the power amplifier element 110 that amplifies the input signal and the other end electrically connected to the output terminal 120d (terminal) connected to the load, and converting the impedance of the output terminal 120d (terminal) connected to the load to the impedance higher than the impedance of the collector (output terminal), the filter circuit 123 (first filter circuit) that attenuates the signal within the first frequency band (e.g., second harmonic wave) higher than the transmission frequency band of the input signal, and the filter circuit 124 (second filter circuit) that attenuates the signal within the second frequency band (fourth harmonic wave) higher than the first frequency band. The filter circuit 123 (first filter circuit) has one end electrically connected to the wiring line between the collector (output terminal) and the output terminal 120d (terminal) connected to the load at the node 120a (first node) and the other end electrically connected to the ground, and the filter circuit 124 (second filter circuit) has one end electrically connected to the wiring line between the transformer 121 and the output terminal 120d (terminal) connected to the load at the node 120c (second node). Thus, the power amplifier module 100 can secure attenuation within the frequency band in which attenuation is desired to be performed and suppress loss within the frequency band in which attenuation is not desired.

The one end of the filter circuit 123 (first filter circuit) of the output matching circuit 120 is electrically connected to the wiring line between the collector (terminal) connected to the load and the transformer 121 at the node 120a (first node). Thus, the power amplifier module 100 can secure attenuation within the frequency band in which attenuation is desired to be performed and suppress loss within the frequency band in which attenuation is not desired.

The output matching circuit 120 of the power amplifier module 100 further includes the filter circuit 125 (third filter circuit) that attenuates the signal within the third frequency band (e.g., third harmonic wave) higher than the first frequency band (e.g., second harmonic wave) and lower than the second frequency band (e.g., fourth harmonic wave). The filter circuit 125 (third filter circuit) is electrically connected to the wiring line between the collector (output terminal) of the power amplifier element 110 and the transformer 121 at the node 120b (third node). Thus, the power amplifier module 100 can secure attenuation within the frequency band in which attenuation is desired to be performed and suppress loss within the frequency band in which attenuation is not desired.

The node 120a (first node) of the output matching circuit 120 is provided closer to the collector (output terminal) of the power amplifier element 110 than the node 120b (third node). Thus, the power amplifier module 100 can secure attenuation within the frequency band in which attenuation is desired to be performed and suppress loss within the frequency band in which attenuation is not desired.

In the output matching circuit 120, the first frequency band (e.g., second harmonic wave), the second frequency band (e.g., fourth harmonic wave), and the third frequency band (e.g., third harmonic wave) are integer multiples of the transmission frequency band, the integer having an even or odd attribute. The filter circuit 124 (second filter circuit) is arranged in a state in which the distance $L_A$ (first distance) between the filter circuit 124 (second filter circuit) and either the filter circuit 123 (first filter circuit) or the filter circuit 125 (third filter circuit) that attenuates the frequency band having the same integer multiple attribute as the integer multiple attribute that the second frequency band has is larger than the distance $L_B$ between the filter circuit 124 (second filter circuit) and either the filter circuit 123 (first filter circuit) or the filter circuit 125 (third filter circuit) that attenuates the frequency band having the integer multiple attribute different from the integer multiple attribute that the second frequency band has. Thus, the power amplifier module 100 can reduce interference between the filter circuits, thereby suppressing deterioration of the characteristics.

In the output matching circuit 120, the filter circuit 123 (first filter circuit) includes a first series circuit of the capacitor 123*b* (first capacitor) and the inductor 123*a* (first inductor) provided between the node 120*a* (first node) and the ground, the filter circuit 124 (second filter circuit) includes a second series circuit of the capacitor 124*b* (second capacitor) and the inductor 124*a* (second inductor) provided between the node 120*c* (second node) and the ground, and the filter circuit 125 (third filter circuit) includes a third series circuit of the capacitor 125*b* (third capacitor) and the inductor 125*a* (third inductor) provided between the node 120*b* (third node) and the ground. The distance $L_A$ (first distance) is the distance between the inductor 124*a* (second inductor) and either the inductor 123*a* (first inductor) or the inductor 125*a* (third inductor) in the filter circuit 123 (first filter circuit) or the filter circuit 125 (third filter circuit) that attenuates the signal within the frequency band having the same integer multiple attribute as the integer multiple attribute that the second frequency band has. The distance $L_B$ (second distance) is the distance between the inductor 124*a* (second inductor) and either the inductor 123*a* (first inductor) or the inductor 125*a* (third inductor) in the filter circuit 123 (first filter circuit) or the filter circuit 125 (third filter circuit) that attenuates the signal within the frequency band having the integer multiple attribute different from the integer multiple attribute that the second frequency band has. Thus, the power amplifier module 100 can reduce interference between the filter circuits, thereby suppressing deterioration of the characteristics.

The filter circuit 124 (second filter circuit) of the output matching circuit 120 is connected to the output terminal 120*d* (terminal) connected to the load through the wiring line L1 (first wiring line) that electrically connects the filter circuit 124 (second filter circuit) to the node 120*c* (second node) and the wiring line L2 (second wiring line) that electrically connects the node 120*c* (second node) to the output terminal 120*d* (terminal) connected to the load. The length of the wiring line L1 (first wiring line) is shorter than the length of the wiring line L2 (second wiring line). Thus, the power amplifier module 100 can secure attenuation within the frequency band in which attenuation is desired to be performed and suppress loss within the frequency band in which attenuation is not desired.

The filter circuit 123 (first filter circuit) of the output matching circuit 120 includes the first series circuit of the capacitor 123*b* (first capacitor) and the inductor 123*a* (first inductor) provided between the node 120*a* (first node) and the ground. The filter circuit 124 (second filter circuit) of the output matching circuit 120 includes the second series circuit of the capacitor 124*b* (second capacitor) and the inductor 124*a* (second inductor) provided between the node 120*c* (second node) and the ground. Thus, the power amplifier module 100 can secure attenuation within the frequency band in which attenuation is desired to be performed and suppress loss within the frequency band in which attenuation is not desired.

The output matching circuit 120 includes the plurality of filter circuits including the filter circuit 123 (first filter circuit) and the filter circuit 124 (second filter circuit). Among the plurality of filter circuits, the filter circuit having one end electrically connected to the wiring line between the collector (output terminal) and the transformer 121 at the predetermined node and the other end electrically connected to the ground attenuates the signal within the frequency band higher than the transmission frequency band and lower than the second frequency band. Thus, the power amplifier module 100 can secure attenuation within the frequency band in which attenuation is desired to be performed and suppress loss within the frequency band in which attenuation is not desired.

The power amplifier module 100 includes the power amplifier element 110 and the multilayer substrate 130 on which the power amplifier element 110 is mounted and including the output matching circuit 120. The multilayer substrate 130 includes the layer (e.g., the layer 134) in which the ground 137 overlapping the wiring line L2 (second wiring line) and the filter circuit 124 (second filter circuit) in a plan view is formed between the layer (e.g., the layer 135) in which the wiring line L2 (second wiring line) electrically connecting the output terminal 120*d* (terminal) connected to the load to the node 120*c* (second node) and the layer (e.g., the layer 131) in which the filter circuit 124 (second filter circuit) is formed. Thus, the power amplifier module 100 can reduce interference between the filter circuit and other circuits, thereby suppressing deterioration of the characteristics.

The multilayer substrate 130 of the power amplifier module 100 includes the shield member 140 that electromagnetically shields the surface 130*a*. At least one of the transformer 121, the filter circuit 123 (first filter circuit), and the filter circuit 124 (second filter circuit) includes at least one inductor (first inductor) on the surface 130*a*, and the inductor (first inductor) is mounted on the surface 130*a* of the multilayer substrate 130 so as the direction of magnetic flux is parallel to the surface 130*a*. Thus, the power amplifier module 100 can reduce interference between the filter circuit and other circuits, thereby suppressing deterioration of the characteristics.

In the multilayer substrate 130 of the power amplifier module 100, the predetermined electronic component is disposed on the surface 130*a*. At least one of the transformer 121, the filter circuit 123 (first filter circuit), and the filter circuit 124 (second filter circuit) includes at least one inductor (second inductor) adjacent to the predetermined electronic component 200 disposed on the surface 130*a*, and the inductor (second inductor) is mounted on the surface 130*a* of the multilayer substrate 130 so as the direction of magnetic flux is perpendicular to the surface 130*a*. Thus, the power amplifier module 100 can reduce interference between the filter circuit and other circuits, thereby suppressing deterioration of the characteristics.

The above-described embodiments are intended to facilitate understanding of the present disclosure, and are not intended to limit the present disclosure. The present disclosure may be modified or improved without departing from the gist thereof, and equivalents thereof are also included in the present disclosure. That is, any design modifications made by those skilled in the art to the embodiments are also included in the scope of the present disclosure as long as they have the features of the present disclosure. The elements included in the embodiments and the arrangement thereof are not limited to those illustrated, and can be appropriately changed.

What is claimed is:

1. An output matching circuit comprising:
a transformer having a first end electrically connected to an output terminal of a power amplifier and a second end electrically connected to a terminal connected to a load, the power amplifier being configured to amplify an input signal, the transformer being configured to convert an impedance of the terminal connected to the load to an impedance greater than an impedance of the output terminal;

a first filter circuit configured to attenuate a signal within a first frequency band, the first frequency band being greater than a transmission frequency band of the input signal;

a second filter circuit configured to attenuate a signal within a second frequency band, the second frequency band being greater than the first frequency band; and a third filter circuit configured to attenuate a third frequency band, the third frequency band being greater than the first frequency band and less than the second frequency band, wherein the first filter circuit has a first end electrically connected at a first node to a wiring line between the output terminal and the terminal connected to the load, and a second end electrically connected to ground, wherein the second filter circuit has a first end electrically connected at a second node to a wiring line between the transformer and the terminal connected to the load, and a second end electrically connected to ground, and wherein the third filter circuit has a first end electrically connected at a third node to the wiring line between the output terminal and the transformer, and a second end electrically connected to ground.

2. The output matching circuit according to claim 1, wherein the first end of the first filter circuit is electrically connected at the first node to a wiring line between the output terminal and the transformer.

3. The output matching circuit according to claim 1, wherein the first node is closer to the output terminal than the third node.

4. The output matching circuit according to claim 1,
wherein the first frequency band, the second frequency band, and the third frequency band are integer multiples of the transmission frequency band, an attribute of the integer multiple being even or odd, and a first distance between the second filter circuit and one of the first filter circuit or the third filter circuit configured to attenuate a signal within a frequency band having the same integer multiple attribute as the second frequency band is greater than a second distance between the second filter circuit and another of the first filter circuit or the third filter circuit configured to attenuate a signal within a frequency band having an integer multiple attribute different from the second frequency band.

5. The output matching circuit according to claim 4,
wherein the first filter circuit comprises a first capacitor and a first inductor connected in series between the first node and ground, wherein the second filter circuit comprises a second capacitor and a second inductor connected in series between the second node and ground, wherein the third filter circuit comprises a third capacitor and a third inductor connected in series between the third node and ground, wherein the first distance is a distance between the second inductor and the first inductor or the third inductor, and the second distance is a distance between the second inductor and the other of the first inductor or the third inductor.

6. The output matching circuit according to claim 1,
wherein the second filter circuit is connected to the terminal connected to the load through a first wiring line and a second wiring line, the first wiring line electrically connecting the second filter circuit to the second node, and the second wiring line electrically connecting the second node to the terminal connected to the load, and wherein a length of the first wiring line is shorter than a length of the second wiring line.

7. The output matching circuit according to claim 1,
wherein the first filter circuit comprises a first capacitor and a first inductor connected in series between the first node and ground, and wherein the second filter circuit comprises a second capacitor and a second inductor connected in series between the second node and the ground.

8. The output matching circuit according to claim 1, further comprising:

a plurality of filter circuits comprising the first filter circuit and the second filter circuit, wherein among the plurality of filter circuits, a filter circuit having a first end electrically connected at a predetermined node to a wiring line between the output terminal and the transformer and a second end electrically connected to ground is configured to attenuate a signal within a frequency band greater than the transmission frequency band and less than the second frequency band.

9. A power amplifier module comprising:
the output matching circuit according to claim 1;
the power amplifier; and
a multilayer substrate on which the power amplifier is mounted and comprising the output matching circuit, wherein the multilayer substrate comprises a layer in which a ground overlapping the second wiring line and the second filter circuit in a plan view is between a layer comprising a second wiring line electrically connecting the terminal connected to the load to the second node and a layer comprising the second filter circuit.

10. The power amplifier module according to claim 9,
wherein the multilayer substrate comprises a shield configured to electromagnetically shield a surface of the multilayer substrate, wherein the first filter circuit and/or the second filter circuit comprises at least one first inductor on the surface, and the at least one first inductor is mounted on the surface of the multilayer substrate such that a direction of magnetic flux through the at least one first inductor is parallel to the surface.

11. The power amplifier module according to claim 9,
wherein an electronic component is on the surface of the multilayer substrate, wherein the transformer, the first filter circuit, and/or the second filter circuit comprises at least one second inductor adjacent to the electronic component on the surface, and wherein the second inductor is mounted on the surface of the multilayer substrate such that a direction of magnetic flux through the second inductor is perpendicular to the surface.

\* \* \* \* \*